United States Patent [19]

Clark et al.

[11] 4,397,511
[45] Aug. 9, 1983

[54] CARTRIDGE HOLDER AND CONNECTOR SYSTEM

[75] Inventors: Richard P. Clark, Hershey; Robert H. Frantz, Carlisle; Gary W. Hawk, Halifax; John A. Root, Harrisburg, all of Pa.

[73] Assignee: AMP Incorporated, Harrisburg, Pa.

[21] Appl. No.: 440,653

[22] Filed: Nov. 10, 1982

Related U.S. Application Data

[62] Division of Ser. No. 252,511, Apr. 8, 1981, Pat. No. 4,379,606.

[51] Int. Cl.³ .................................................. H01R 23/70
[52] U.S. Cl. ........................... 339/17 CF; 339/17 LC; 339/113 R; 339/210 M; 339/211
[58] Field of Search ........ 339/17 CF, 17 LC, 17 LM, 339/17 M, 75 M, 91 R, 113 R, 113 L, 176 M, 176 MP, 184 R, 184 M, 186 R, 186 M, 206 R, 210 R, 210 M, 211

[56] References Cited

U.S. PATENT DOCUMENTS

| 3,035,243 | 5/1962 | Bowling | 339/75 M |
| 3,588,784 | 6/1971 | Kunkle et al. | 339/113 R |
| 3,905,673 | 9/1975 | Evans et al. | 339/210 M |
| 4,050,769 | 9/1977 | Ammon | 339/210 M |
| 4,345,813 | 8/1982 | Hatch | 339/184 M |
| 4,364,618 | 12/1982 | Godsey | 339/17 LC |
| 4,366,527 | 12/1982 | Bell | 339/17 LC |
| 4,369,485 | 1/1983 | Bell et al. | 339/17 LC |

FOREIGN PATENT DOCUMENTS 832658 4/1960 United Kingdom ............ 339/184 R

Primary Examiner—John McQuade
Attorney, Agent, or Firm—Russell J. Egan

[57] ABSTRACT

A cartridge holder and interconnect system is disclosed formed primarily of two components, namely, a cartridge and an assembly for receiving and holding the cartridge. The holder assembly includes a housing of rigid insulative material and a connector member adapted to engage a circuit board or the like and to engage the cartridge. The holder assembly also has a replaceable face plate profiled for polarizing and keying reception of an appropriate cartridge in the housing. The face plate is detachably secured to the housing so that by simply replacing the face plate the housing can be adapted to receive different cartridges. The housing is also adapted to be situated spaced above a circuit board so as to accommodate components thereunder thereby preserving the available surface of circuit board. The cartridge is formed by a two-piece housing enclosing a circuit board having components, such as integrated circuits, mounted thereon and held within the cartridge in such fashion as to obviate the need for potting, etc. The cartridge also has a connector portion with a profiled mating face for keying and means for covering or exposing a reflective surface used to disable a writing capability for the circuit carried by the cartridge.

7 Claims, 5 Drawing Figures

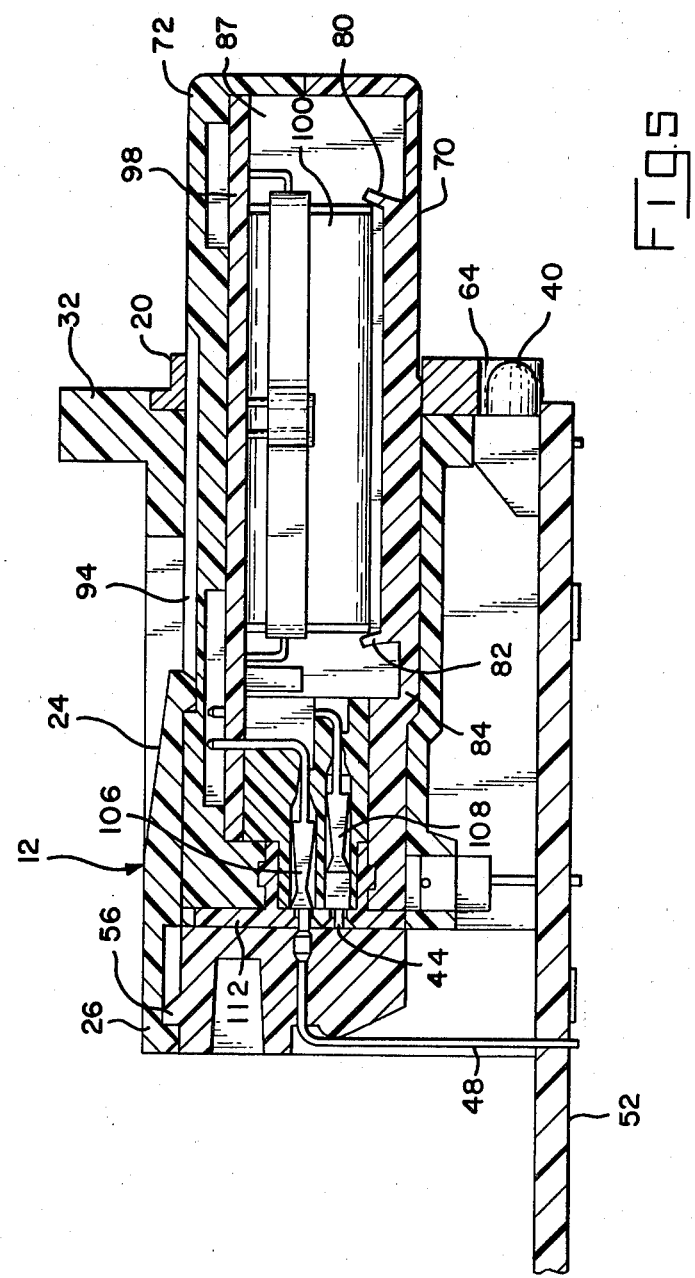

CARTRIDGE HOLDER AND CONNECTOR SYSTEM

This is a division of application Ser. No. 252,511, filed Apr. 8, 1981, now U.S. Pat. No. 4,379,606.

BACKGROUND OF THE INVENTION

1. The Field Of The Invention

The present invention relates to a system for mounting and interconnecting a cartridge with a circuit board or the like and in particular to a system wherein a single holder can be utilized with a wide variety of cartridges.

2. The Prior Art

There is a growing need for electronic equipment to be able to accommodate memory, and other add-on components, in the form of cartridges so that primary equipment can be readily adapted to perform a wide variety of functions. An example of this would be cartridges containing tapes having computer programs thereon and which cartridges could be inserted into a portion of a computer to run a specific program. Likewise, a cartridge could contain an information storage system, such as a bubble memory, and be inserted into a computer in order to supply it with specific information relating to a particular program. Heretofore, systems that were capable of handling cartridges have not had the desired versatility and/or were extremely expensive.

SUMMARY OF THE INVENTION

The present invention relates to a cartridge holder assembly utilized to detachably connect a cartridge to a main equipment unit. The subject assembly includes a cartridge holder which is mounted on a circuit board or like portion of the main equipment unit and defines a cavity for receiving a cartridge therein. Both the cartridge and the holder include electrical interconnecting means to effect the electrical interconnection between the cartridge and the circuit board of the main equipment unit. The holder has one portion defining a cartridge receiving cavity and a second portion defining an electrical interconnection means for making interconnection between the circuit board and the cartridge. The holder also includes a removable face plate serving to polarize and key the holder for reception of various cartridges without otherwise required reconfiguring of the holder. The cartridge has mating first and second housing members defining a circuit receiving cavity therebetween and electrical connector means connected to the circuitry and exposed at one end of the cartridge. The cartridge also includes a profiled face for polarizing and keying the cartridge. The cartridge also, preferably, has a profile making it suitable for stacking and housing members which can be separated with standard tools to facilitate repair when necessary.

It is therefore an object of the present invention to produce an improved cartridge holder assembly which can be utilized to detachably mate any one of a plurality of information cartridges to a main equipment unit in a ready and economic manner.

It is another object of the present invention to produce an improved cartridge holder having a housing received on and spaced above a circuit board so as to allow utilization of substantially the entire surface of the circuit board.

It is a further object of the present invention to produce a cartridge holder in which a holder assembly has a removable face plate defining a cartridge receiving opening which is both polarized and keyed allowing simple adaptation of the holder for a wide variety of cartridges to be received therein.

It is another object of the present invention to produce an improved cartridge holder wherein an integrated circuit assembly can be mounted in a cartridge without the use of potting or other securing means but which will allow the addition of thermal conductive means if desired.

It is a further object of the present invention to produce a cartridge holder assembly which can be utilized for detachably inserting bubble memory containing cartridges into main equipment, such as a computer, with the equipment being readily reconfigured to accept only a specific one of a plurality of different cartridges and with the cartridges readily arranged to accept the rewrite of material contained therein or to bar any alteration of the contained material.

It is another object of the present invention to produce an improved cartridge holder system and components thereof which can be readily and economically produced.

The means for accomplishing the foregoing objects and other advantages of the present invention will become apparent to those skilled in the art from the following detailed description taken with reference to the accompanying drawings.

BRIEF DESCRIPTION OF THE DRAWINGS

FIG. 5 is a vertical longitudinal section through the cartridge and housing of FIG. 3 in the assembled condition.

DETAILED DESCRIPTION OF THE PREFERRED EMBODIMENT

Figure 1:
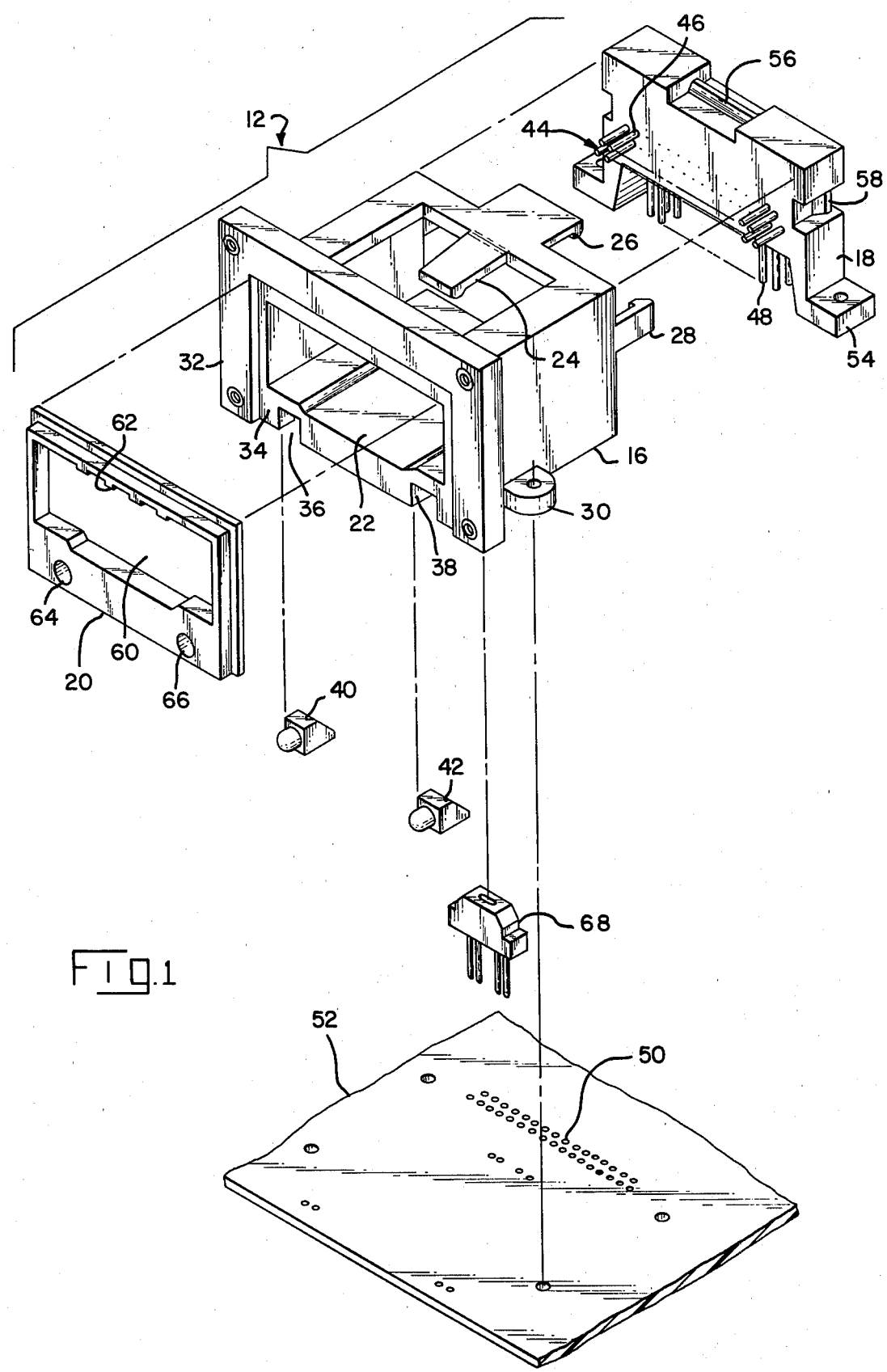
FIG. 1 is an exploded perspective view of the housing portion of the subject cartridge holder system.
Figure 2:
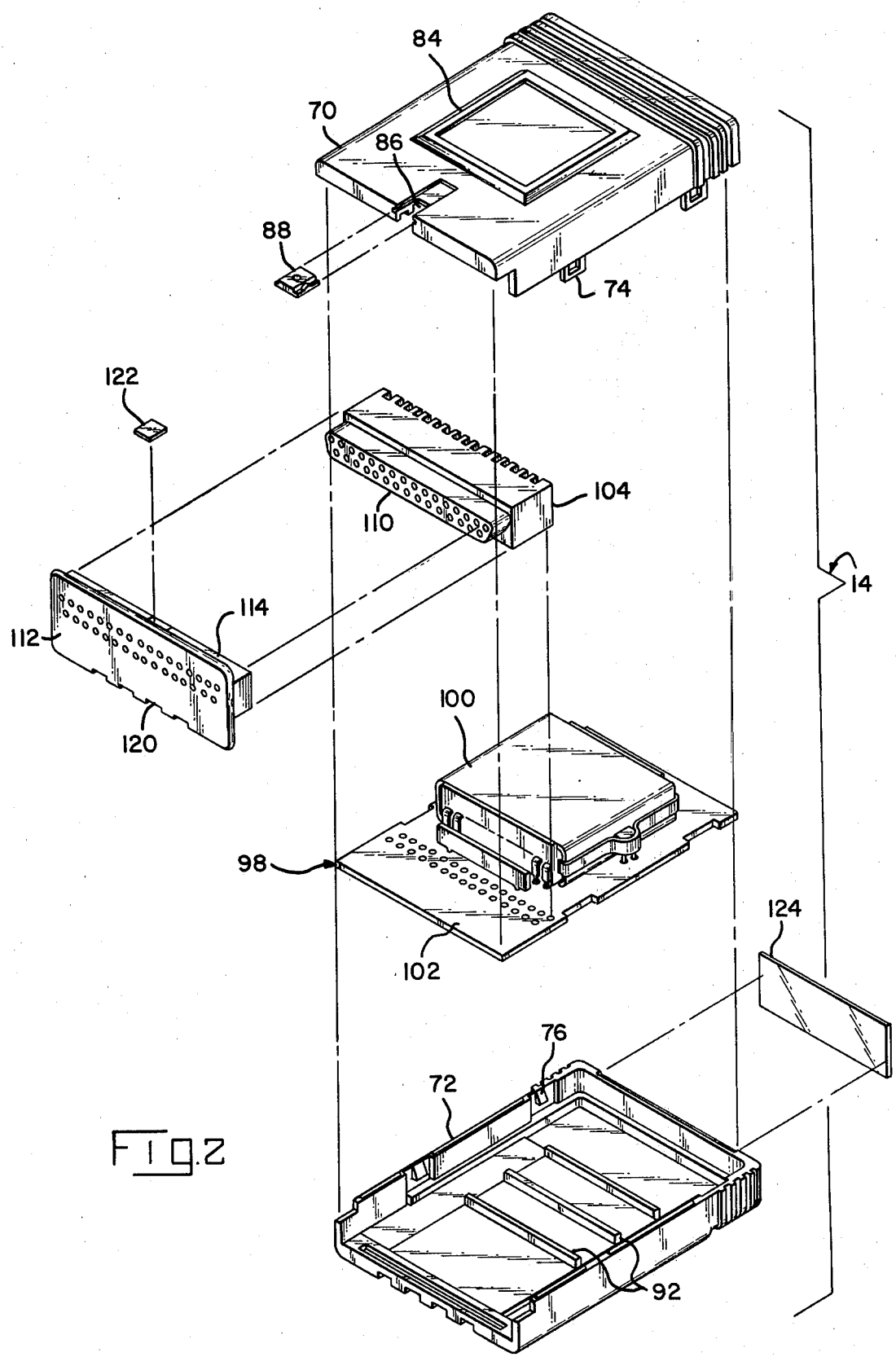
FIG. 2 is an exploded perspective view of the cartridge portion of the subject cartridge holder system.
Figure 3:
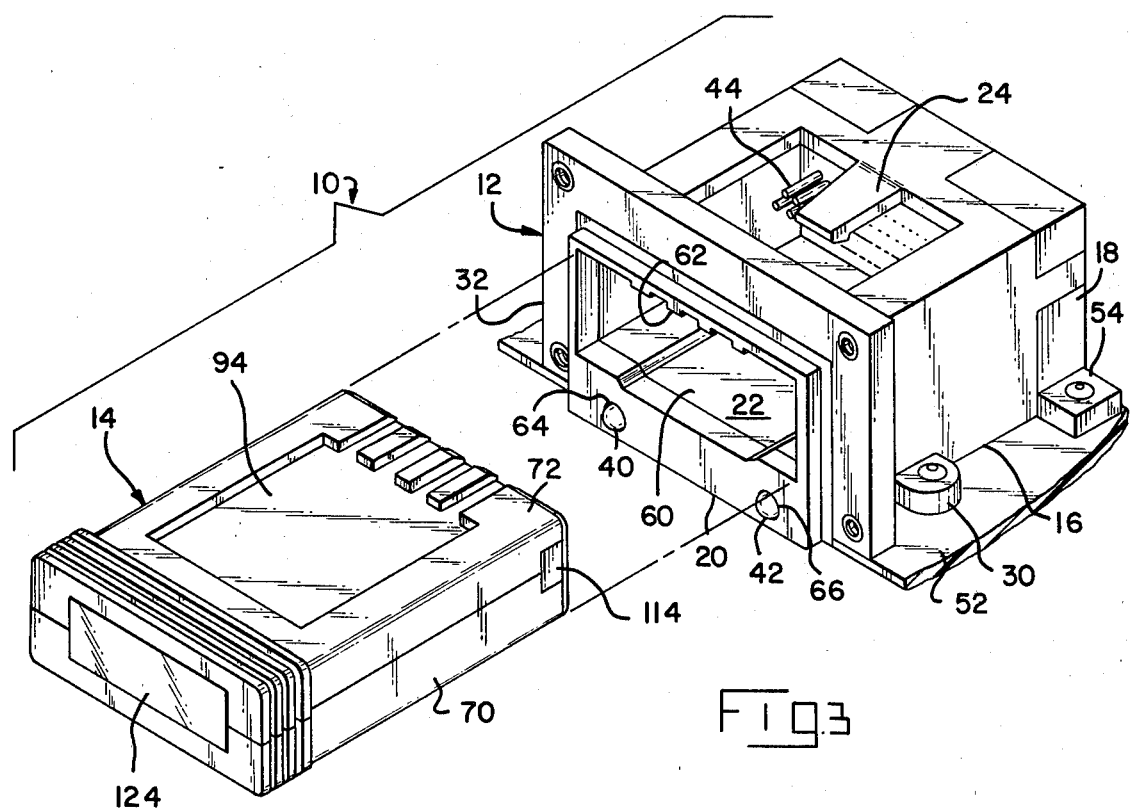
FIG. 3 is a perspective view of the assembled housing of FIG. 1 with the assembled cartridge of FIG. 2 exploded therefrom.

The subject cartridge holder connector system 10 (FIG. 3) includes a holder housing 12 (FIG. 1) and a cartridge 14 (FIG. 2). The holder housing 12 is formed by a main housing member 16, a connector housing 18, and a face plate 20 all preferably formed of rigid insulative material. The main housing 16 defines a cartridge receiving cavity 22 with at least one locking latch 24 extending along one side of and directed into the cavity. The main housing also has a plurality of rearwardly extending locking latches 26, 28, and downwardly directed mounting feet 30. The main housing is completed by an integral front flange 32, which has a recess 34 to receive face plate 20 and indents 36, 38, which receive a pair of light emitting diodes 40, 42, respectively. The connector housing 18 is an integral member of rigid insulative material having a plurality of terminals 44 mounted therein, each terminal having a pin portion 46 extending into the cavity 22 and a depending leg portion 48 which is adapted to be received in a like pin aperture 50 in a circuit board 52 to be secured to the circuitry thereof in conventional fashion, such as by way of soldering. The connector housing 18 also includes mounting feet 54 and profiled latching detents 56, 58.

The face plate 20 is profiled to be received in the recess 34 in the front flange 32 of the main housing 16 and defines a cartridge receiving aperture 60 with a plurality of inwardly directed keying and polarizing lugs 62. The face plate 20 also has a pair of apertures 64, 66, which are aligned with the respective indents 36, 38 so that diodes 40, 42 are visible.

The main housing 16 overlies a source and sensor assembly 68 which is secured to the circuit board 52. The purpose of this assembly will be discussed later.

Figure 4:
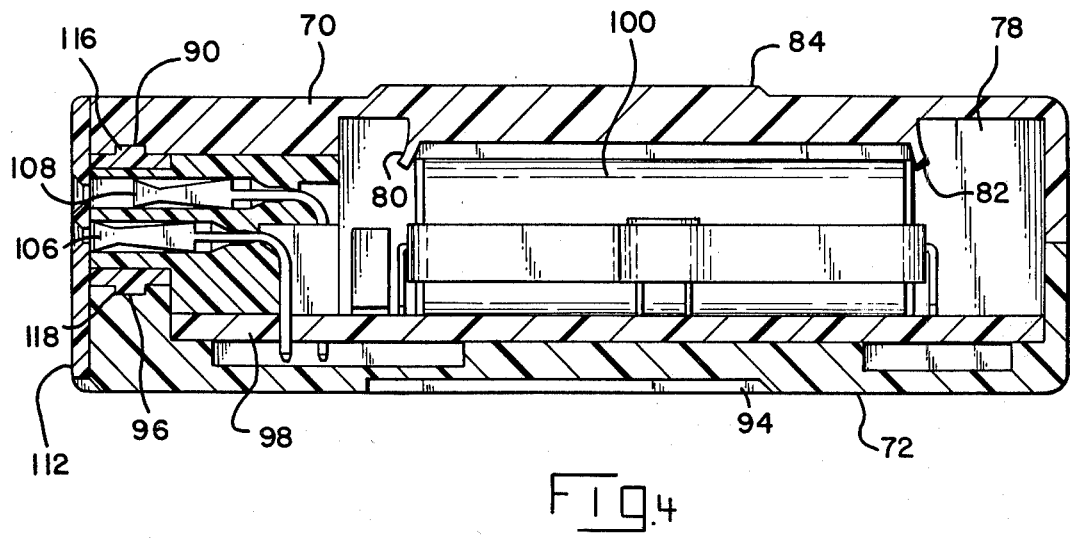
FIG. 4 is a vertical longitudinal section through the assembled cartridge of FIG. 3.

The cartridge assembly 14 is best seen in FIG. 2 and has first cover 70 and second cover 72 each having respective latching means 74, 76 to detachably secure the cover members together defining a cavity 78 therebetween. The first cover 70 includes a plurality of integral, inwardly directed, resilient mounting flanges 80, 82, and an outwardly directed stacking profile 84, the purposes of which will be discussed below. The first cover 70 also includes a profiled slot 86 in which a switch plate 88 is slidably positioned and a transverse, inwardly directed recess 90 (see FIG. 4). The second cover 72 has a plurality of integral, inwardly directed support bars 92, outwardly directed, profiled stacking recess 94, and a transverse, inwardly directed recess 96 (see FIG. 4). A circuit board assembly 98, include a variety of components, such as the illustrated bubble memory 100, connected to a circuit board 102 in conventional fashion. A receptacle housing 104 containing a first row of terminals 106 and a second row of terminals 108 is secured to one edge of the circuit board 102 as best seen in FIG. 4. The housing 104 includes a profiled mating face 110. The cartridge 14 is completed by a front cover 112 having a rearwardly directed peripherial flange 114, adapted to enclose mating face 110, and outwardly directed ridges 116, 118 adapted to engage in recesses 90, 96, respectively. The front cover is also profiled with a series of keying projections 120. A tab of reflective tape 122 and an identification plate 124 are also included. The cartridge would be assembled by first forming the circuit board assembly 98 by mounting components 100 and receptacle housing 104 on circuit board 102. The terminals 106, 108 and components 100 would be secured to the circuit board in conventional fashion, such as by wave soldering. The front cover 112 would next be applied with flange 114 enclosing mating face 110. This assembly would be placed in cover 72, tape 122 added, and cover 70 applied to complete the cartridge. It will be appreciated that engagement of ridges 116, 118 in recesses 90, 96 and latching means 74, 76 will securely hold the cartridge together.

It should be noted that the front cover 112 would have to have the same configuration as the face plate 20 for the cartridge 14 to be received in housing 12, In order to change the keying configuration, it is only necessary to replace these two parts.

When the cartridge 14 is fully inserted into the housing 12, the reflective tape 122 will either be covered or exposed by the positioning of the switch plate 88. This fact will be noted by the source-sensor assembly 68 which will either enable alteration of the information stored in the cartridge or disable the cartridge from having the information changed.

It should also be noted, from FIG. 4, that one terminal 108 illustrated is seated slightly deeper into the housing 104 than the rest of the terminals. The illustrated terminal 108 is the only one of the second row which has offset location. This means that when the cartridge is being withdrawn from the housing, terminal 108 will be the first to disengage and this will shut off the necessary circuitry to prevent erasure of material stored in the cartridge.

The present invention may be subject to many modifications and changes without departing from the spirit or essential characteristics thereof. The present embodiment is therefore intended in all respects as being illustrative and not restrictive of the scope of the invention.

What is claimed is:

1. An electronic component carrying cartridge for mounting in a housing of an electrical system to provide said system with additional components, memory storage and the like, said cartridge comprising:

mating first and second housing covers defining a cavity therebetween, one end of said cavity being open;

an electronic assembly received in said cavity, said assembly having a circuit board, electronic components mounted on said circuit board, an electrical connector mounted along one edge of said circuit board, and a plurality of terminals mounted in said connector with each terminal having a first end connected to said circuit board and a second end directed outwardly of said cavity; and a cover plate closing said cavity, having a portion enclosing said connector and a plurality of apertures providing access to said terminals, said cover plate having an outwardly directed profile allowing insertion of said cartridge only into a like profiled cartridge receiving cavity of said electrical system.

2. The cartridge according to claim 1 further comprising:

a slot formed in one of said covers, plate means slidably received in said slot, and reflective means secured in said slot whereby when said plate means is in a first position said reflective means is covered and when said plate means is in a second position said reflective means is exposed.

3. The cartridge according to claim 1 further comprising:

an externally directed profiled recess in one of said covers; and an externally directed like profiled projection in the other of said covers whereby a plurality of said cartridges can be stacked one upon another.

4. The cartridge according to claim 1 further comprising:

at least one terminal having a shorter configuration than the other terminals whereby said one terminal will disconnect before the others upon removal of said cartridge from a system disabling the electronic assembly carried thereby.

5. The cartridge according to claim 1 further comprising:

an identification plate secured to one of said housing covers.

6. The cartridge according to claim 1 further comprising:

at least one rigid inwardly directed flange on one of said housing covers, and at least one resilient inwardly directed flange on the other of said housing covers whereby said electronic assembly will be securely supported in said cavity without the need of further means.

7. The cartridge according to claim 1 further comprising:
- an outwardly directed peripheral flange on said cover plate, and
- an inwardly directed recess on each said housing cover forming a continuous inwardly directed recess about the open end of said cavity, said flange of said cover plate being received in said recess of said housing covers to secure said cartridge together in an assembled condition.

* * * * *